United States Patent
Paik

(10) Patent No.: US 7,368,769 B2
(45) Date of Patent: May 6, 2008

(54) MOS TRANSISTOR HAVING A RECESSED GATE ELECTRODE AND FABRICATION METHOD THEREOF

(75) Inventor: Jae-Choel Paik, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 352 days.

(21) Appl. No.: 11/184,801

(22) Filed: Jul. 20, 2005

(65) Prior Publication Data

US 2006/0017099 A1   Jan. 26, 2006

(30) Foreign Application Priority Data

Jul. 23, 2004    (KR) ...................... 10-2004-0057855

(51) Int. Cl.
  H01L 27/148   (2006.01)
  H01L 21/336   (2006.01)
  H01L 29/768   (2006.01)

(52) U.S. Cl. ............... 257/243; 438/270; 257/E21.429; 257/E29.135

(58) Field of Classification Search ................ 438/270, 438/259, 268, 197; 257/E29.135, E29.152, 257/E29.266, E29.267, 330, 288, 243, E21.429, 257/E21.205

See application file for complete search history.

(56) References Cited

U.S. PATENT DOCUMENTS

| 7,148,527 | B2 | 12/2006 | Kim et al. |
| 2003/0170955 | A1 | 9/2003 | Kawamura et al. |
| 2004/0135176 | A1 | 7/2004 | Kim |
| 2004/0166637 | A1* | 8/2004 | Ito et al. ...................... 438/270 |
| 2007/0090452 | A1* | 4/2007 | Cho et al. .................... 257/330 |
| 2007/0148980 | A1* | 6/2007 | Cho ........................... 438/700 |
| 2007/0170522 | A1* | 7/2007 | Lee et al. .................... 257/401 |
| 2007/0173007 | A1* | 7/2007 | Lee et al. .................... 438/209 |
| 2007/0190716 | A1* | 8/2007 | Kim ........................... 438/243 |
| 2007/0200169 | A1* | 8/2007 | Kim ........................... 257/330 |
| 2007/0221991 | A1* | 9/2007 | Chung et al. ................ 257/347 |
| 2007/0224762 | A1* | 9/2007 | Lee ............................ 438/259 |
| 2007/0235778 | A1* | 10/2007 | Shim .......................... 257/288 |
| 2007/0246774 | A1* | 10/2007 | Chung et al. ................ 257/347 |

FOREIGN PATENT DOCUMENTS

| JP | 03-266424 | 11/1991 |
| JP | 2003-023150 | 1/2003 |
| KR | 2000-0026816 | 5/2000 |
| KR | 10-2004-0054248 | 6/2004 |
| KR | 10-2004-0064924 | 7/2004 |
| WO | WO 03/010827 | 2/2003 |

* cited by examiner

*Primary Examiner*—Walter Lindsay, Jr.
(74) *Attorney, Agent, or Firm*—Lee & Morse, P.C.

(57) ABSTRACT

A metal oxide semiconductor (MOS) transistor having a recessed gate electrode and a fabrication method thereof are provided. The MOS transistor includes a semiconductor substrate and an isolation layer formed in a predetermined region of the semiconductor substrate to define an active region. A channel trench region is disposed within the active region to cross the active region. A gate insulating layer is disposed to cover sidewalls and a bottom of the channel trench region. The MOS transistor has a gate pattern that fills the channel trench region and crosses above the active region. A portion of the sidewall of the gate pattern is recessed at an upper corner of the channel trench region and has a width smaller than the width of the top of the gate pattern and smaller than the width of the channel trench region.

21 Claims, 11 Drawing Sheets

MOS TRANSISTOR HAVING A RECESSED GATE ELECTRODE AND FABRICATION METHOD THEREOF

BACKGROUND OF THE INVENTION

1. Field of the Invention

The present invention relates to a semiconductor device and a fabrication method thereof, and more particularly, to a metal oxide semiconductor (MOS) transistor having a recessed gate electrode and a fabrication method thereof.

2. Description of the Related Art

Increases in the integration density of semiconductor memory devices such as dynamic random access memory (DRAM) are typically accompanied by corresponding decreases in the area occupied by MOS transistors in the devices. As a result, the channel length of the MOS transistors is typically reduced, which may cause a short channel effect. When the short channel effect occurs in an access MOS transistor employed as a memory cell in a DRAM device, a threshold voltage of the DRAM cell decreases and leakage current increases, which degrades a refresh property of the DRAM device. Accordingly, a MOS transistor having a recessed gate electrode capable of suppressing the short channel effect by increasing the gate channel length, even when the integration density of the DRAM device is increased, has been developed.

In a MOS transistor having the recessed gate electrode, the semiconductor substrate may be partially recessed to form a gate in the recessed region and to form a channel in the silicon substrate at both sides of the gate.

FIG. 1 illustrates a cross-sectional view of a conventional MOS transistor having a recessed gate electrode.

Referring to FIG. 1, an active region A is disposed in a predetermined region of a semiconductor substrate 100. The active region A is defined by an isolation layer (not shown). A channel trench region 104 is disposed to cross a predetermined part of the active region A. A gate insulating layer 106 is disposed to cover the bottom and sidewalls of the channel trench region 104. A gate pattern 114 is disposed to fill the channel trench region 104, which is covered by the gate insulating layer 106, and to cross the active region A. The gate pattern 114 is composed of a polysilicon pattern 108, a tungsten silicide pattern 110 and a hard mask pattern 112. An insulating layer spacer 116 is formed to cover sidewalls of the gate pattern 114. Source and drain regions 118 are disposed within the active region A, below both sides of the gate pattern 114.

The MOS transistor having the recessed gate electrode shown in FIG. 1 has an outer gate shape in which the channel trench region 104 and the gate pattern 114 have the same width. The outer gate has a concentrated electric field at an upper corner of the active region adjacent to the polysilicon pattern 108, the upper corner marked by a dotted circle denoted by reference numeral 120. Due to the concentrated electric field, the threshold voltage property of the device is degraded and the leakage current is increased.

Methods for preventing electric field concentration at an upper corner of an active region adjacent to a gate polysilicon pattern have been developed. In one such method, the concentration of the electric field at the upper corner of the active region is prevented to reduce the leakage current. In particular, a main trench and a parasitic trench, adjacent to the main trench, are formed in a substrate. A thermal oxide layer is formed in the main trench and a gate oxide layer is formed in the parasitic trench relatively thicker than in other regions. A conductive layer for forming the gate electrode is buried within the trench.

While this method may prevent the concentration of the electric field at the upper corner of the active region so that leakage current can be suppressed, since the area of the active region decreases when the width of the top of the trench increases, the current drivability of the device is degraded.

In order to prevent the concentrated electric field of the outer gate and the decreased current drivability due to the increased top width of the trench, a method of forming an inner gate-type gate pattern in which the width of the gate pattern is smaller than the width of the trench has been proposed. However, the decreased gate size may result in misalignment, and a metal silicide layer formed on the polysilicon may be cracked when the surface of the metal silicide layer is not uniform.

Thus, a method of fabricating a MOS transistor having a recessed gate electrode which can prevent concentration of the electric field at an upper corner of an active region, and having a gate pattern whose top width is equal to the width of the channel trench region, is needed.

SUMMARY OF THE INVENTION

The present invention is therefore directed to a MOS transistor having a recessed gate electrode and fabrication method thereof, which substantially overcome one or more of the problems due to the limitations and disadvantages of the related art.

It is therefore a feature of an embodiment of the present invention to provide a MOS transistor having a recessed gate electrode, and a fabrication method thereof, that may avoid unnecessarily reducing the size of an active area of the transistor.

It is therefore another feature of an embodiment of the present invention to provide a MOS transistor having a gate electrode with a concave recess formed in a gate trench, wherein the recess may be filled with an insulating layer formed between the gate electrode and an adjacent edge of a gate trench.

At least one of the above and other features and advantages of the present invention may be realized by providing a metal oxide semiconductor transistor having a recessed gate electrode, which may include a semiconductor substrate, an isolation layer disposed in the semiconductor substrate to define an active region, a channel trench disposed within the active region and crossing the active region, a gate insulating layer covering a bottom and sidewalls of the channel trench, and a gate pattern disposed to cross above the active region and fill the channel trench, wherein the gate pattern may have a recessed sidewall that is recessed adjacent to an upper corner of the channel trench, a width of the gate pattern at the recessed sidewall may be smaller than a width of the gate pattern at a topmost surface of the gate pattern.

The transistor may further include an insulating layer spacer covering the recessed sidewall of the gate pattern. The insulating layer spacer may be formed to fill the recessed sidewall at the upper corner of the channel trench, and may be a silicon oxide layer or a silicon nitride layer. The gate pattern may be a stacked structure including a lower conductive layer pattern and an upper conductive layer pattern, and the recessed sidewall may be formed in the lower conductive layer pattern.

The width of the channel trench may be in a range of 1000 Å to 1200 Å, and the width of the gate pattern at the recessed sidewall adjacent to the upper corner of the channel trench region may be 100 Å to 300 Å smaller than the width of the gate pattern at the topmost surface of the gate pattern.

At least one of the above and other features and advantages of the present invention may also be realized by providing a transistor having a recessed gate, which may include a gate formed in a gate trench, the gate having a concave sidewall, wherein an upper curved portion of the concave sidewall extends above an upper surface of the gate trench and a lower curved portion of the concave sidewall extends below the upper surface of the gate trench.

A width of the gate at the upper surface of the gate trench may be less than a width of the gate above the upper surface of the gate trench and may be less than a width of the gate below the upper surface of the gate trench. The transistor may also include an insulating layer formed along the concave sidewall and having a convex portion formed along the upper and lower curved portions of the concave sidewall.

At least one of the above and other features and advantages of the present invention may further be realized by providing a method of fabricating a metal oxide semiconductor transistor having a recessed gate electrode, which may include forming an isolation layer within a semiconductor substrate to define an active region, forming a channel trench region within the active region and crossing the active region, forming a gate insulating layer covering a bottom and sidewalls of the channel trench region, forming a lower conductive layer filling the channel trench region covered by the gate insulating layer, forming a upper conductive layer on the lower conductive layer, patterning the upper conductive layer and the lower conductive layer to form a gate pattern crossing the active region and the channel trench region, and performing an isotropic etching process to partially recess a sidewall of the patterned lower conductive layer at the upper part of the channel trench region.

The channel trench region may be formed to a width of 1000 Å to 1200 Å. The partially recessed sidewall of the patterned lower conductive layer may be etched by 100 Å to 300 Å in the isotropic etching process. The lower conductive layer may include polysilicon, and the upper conductive layer may include a metal silicide. The metal silicide may include tungsten silicide.

The isotropic etching process may be carried out using a gas including HBr and $O_2$, and may be carried out using a bias power of 40 W to 80 W. The method may further include forming an insulating layer spacer covering sidewalls of the gate pattern and filling the partially recessed sidewall of the patterned lower conductive layer. Forming the insulating layer spacer may include forming a conformal insulating layer and anisotropically etching the insulating layer to form the insulating layer spacer covering the sidewall of the gate pattern.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF THE INVENTION

Figure 1:
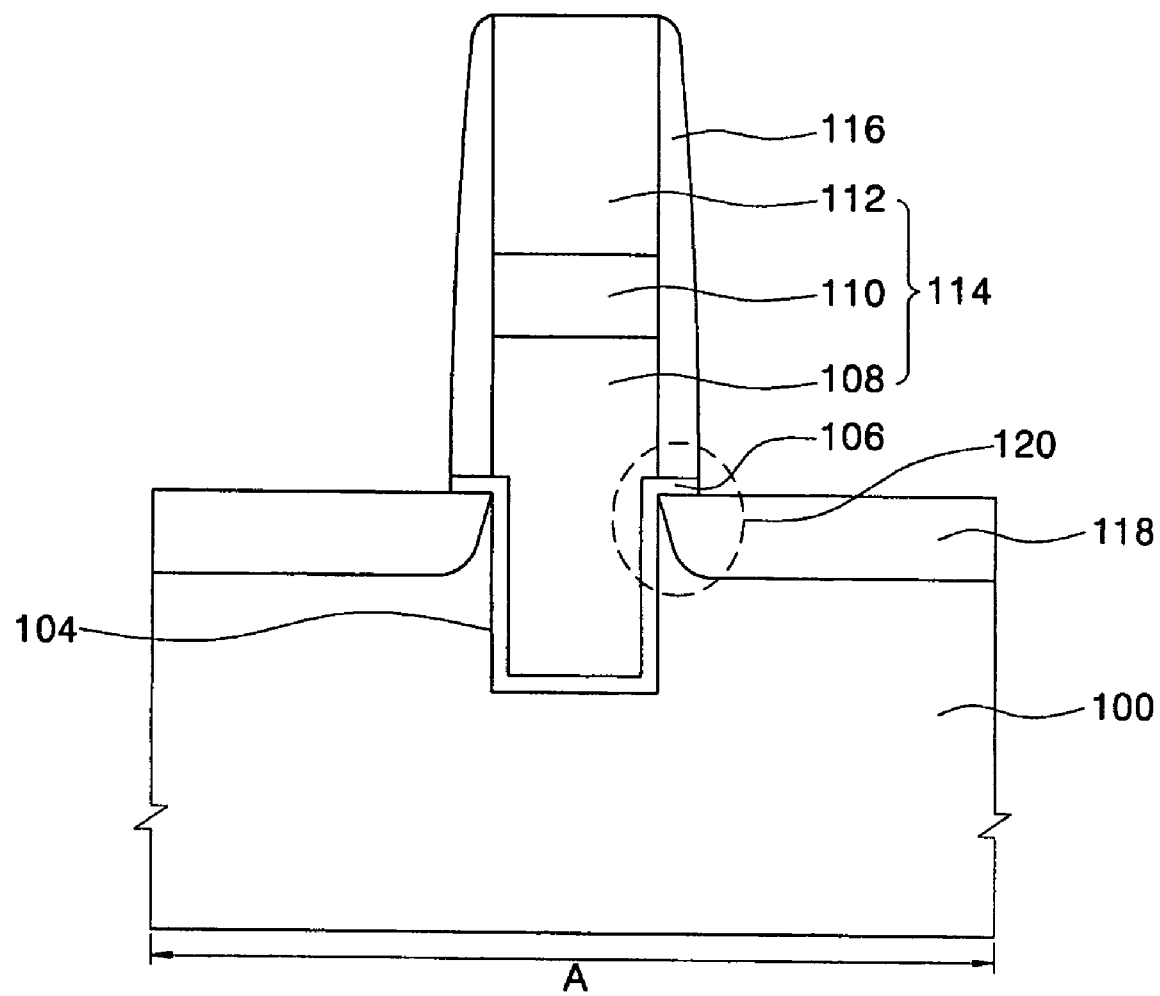
FIG. 1 illustrates a cross-sectional view of a conventional MOS transistor having a recessed gate electrode.

Korean Patent Application No. 2004-57855, filed Jul. 23, 2004, in the Korean Intellectual Property Office, and entitled: "MOS Transistor Having a Recessed Gate Electrode and Fabrication Method Thereof," is incorporated herein by reference in its entirety.

The present invention will now be described more fully hereinafter with reference to the accompanying drawings, in which exemplary embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. It will also be understood that when a layer is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Figure 2:
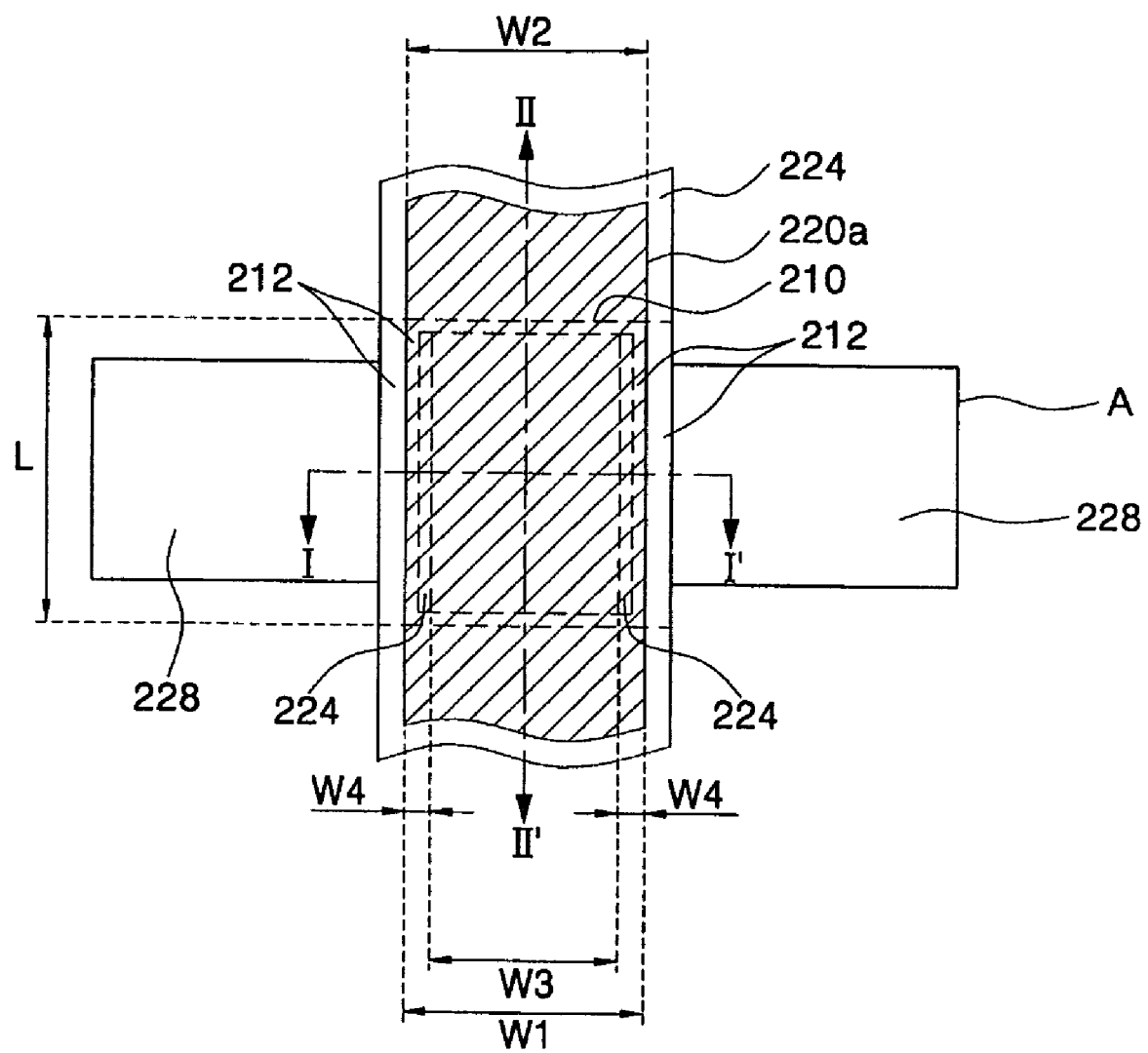
FIG. 2 illustrates a plan view of a MOS transistor having a recessed gate electrode, in accordance with an embodiment of the present invention.
Figure 3A:
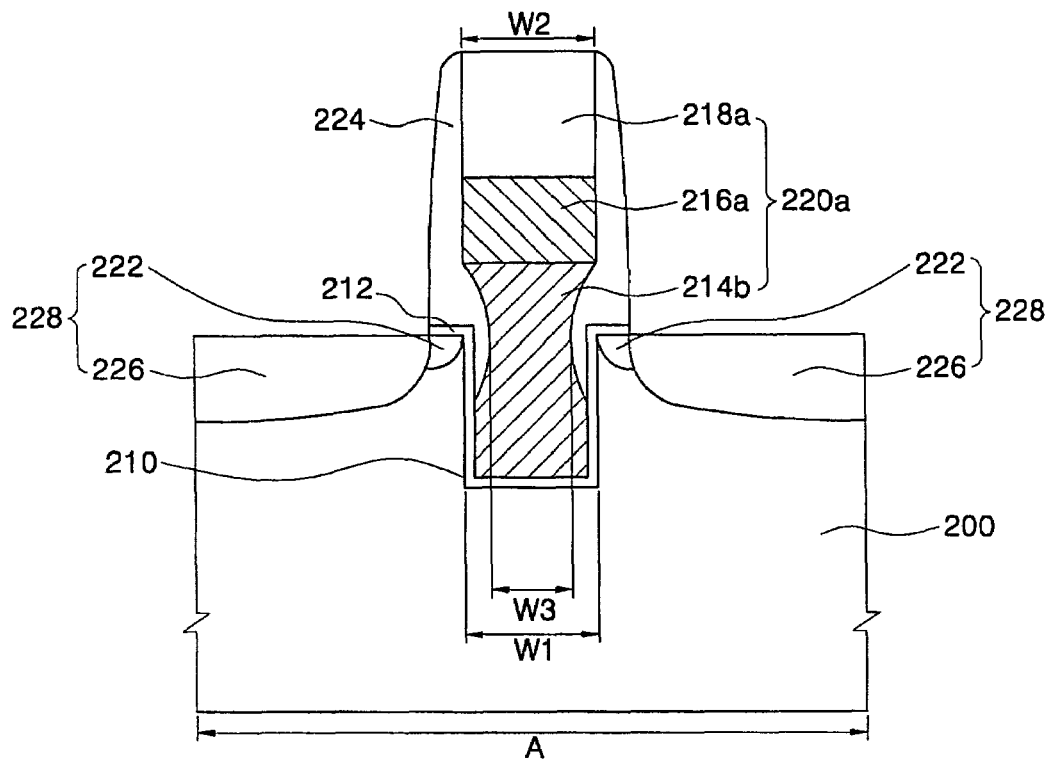
FIG. 3A illustrates a cross-sectional view taken along line I-I' of FIG. 2.
Figure 3B:
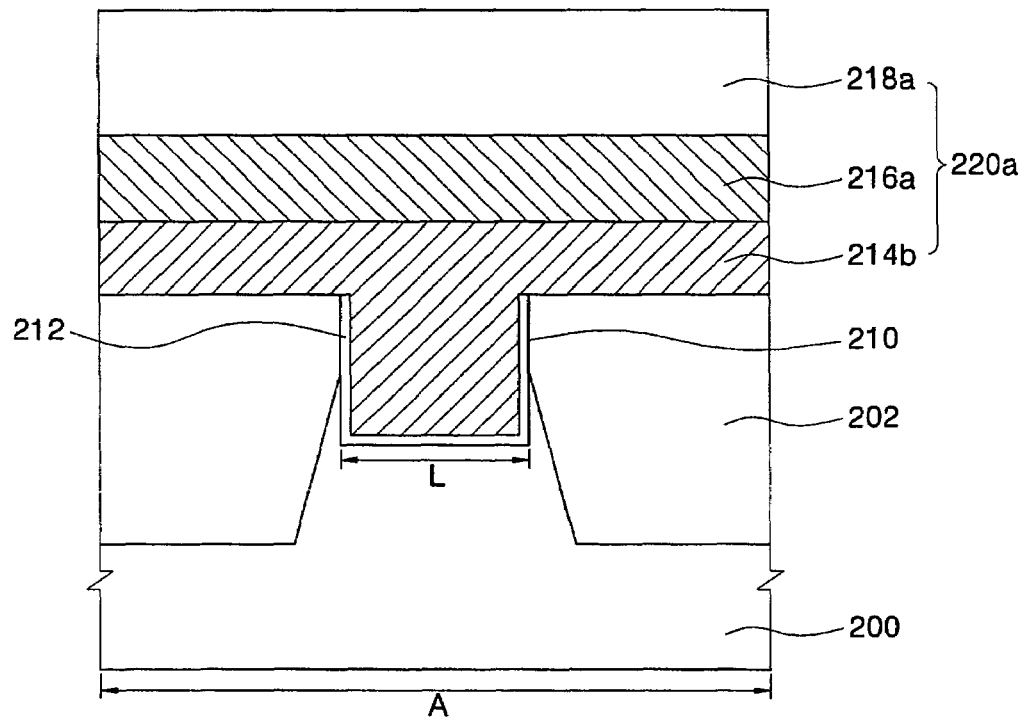
FIG. 3B illustrates a cross-sectional view taken along line II-II' of FIG. 2.

FIG. 2 illustrates a plan view of a MOS transistor having a recessed gate electrode, in accordance with an embodiment of the present invention, FIG. 3A illustrates a cross-sectional view taken along line I-I' of FIG. 2, and FIG. 3B illustrates a cross-sectional view taken along line II-II' of FIG. 2.

Referring to FIGS. 2, 3A and 3B, an active region A in a semiconductor substrate 200 is defined by an isolation layer 202. A channel trench region 210 is disposed to cross a predetermined part of the active region A. As a result, the active region A is divided into two isolated active regions separated from each other by the channel trench region 210. The channel trench region 210 is disposed so as to have any width W1 in the I-I' direction and any length L in the II-II' direction.

A gate insulating layer 212 is disposed to cover the bottom and sidewalls of the channel trench region 210. The gate insulating layer 212 may extend to cover top surfaces of the isolated active regions.

A recessed gate pattern 220a is disposed to fill the channel trench region 210 covered by the gate insulating layer 212. The recessed gate pattern 220a is disposed to cross the active region A. The recessed gate pattern 220a may include a recessed lower conductive layer pattern 214b, an upper conductive layer pattern 216a and a hard mask pattern 218a. A top width W2 of the recessed gate pattern 220a may be substantially equal to the width W1 of the channel trench region 210. The recessed lower conductive layer pattern 214b may be disposed such that both of its sidewalls are partially recessed at a region adjacent to an upper corner of the active region A. That is, the recessed lower conductive layer pattern 214b may be disposed such that both of its sidewalls are partially recessed at a region adjacent to an upper part of the channel trench region 210. The recessed lower conductive layer pattern 214b of the gate pattern has a width W3 smaller than the top width W2 of the recessed gate pattern 220a and smaller than the width W1 of the channel trench region 210 at the upper part of the channel trench region 210.

An insulating layer spacer 224 may be disposed to cover the sidewalls of the recessed gate pattern 220a. The insulating layer spacer 224 extends from the upper corner of the channel trench region 210, between the gate insulating layer 212 and the recessed lower conductive layer pattern 214b. The insulating layer spacer 224 covers the gate insulating layer 212. Accordingly, the upper corner of the active region and the recessed lower conductive layer pattern 214b of the recessed gate pattern 220a are spaced apart from each other. That is, the width W3 of the recessed lower conductive layer pattern 214b is smaller than the width W1 of the channel trench region 210 at the upper part of the channel trench region 210.

A pair of source and drain regions 228 having a lightly doped impurity region 222 and a heavily doped impurity region 226 may be disposed in the isolated active regions below both sides of the recessed gate pattern 220a.

A method of fabricating a MOS transistor having a recessed gate electrode according to an embodiment of the present invention will now be described.

FIGS. 4A, 5A, 6A, 7A, 8A and 9A illustrate cross-sectional views, taken along line I-I' of FIG. 2, of stages in a method of fabricating a MOS transistor, in accordance with an embodiment of the present invention.

Figure 4A:
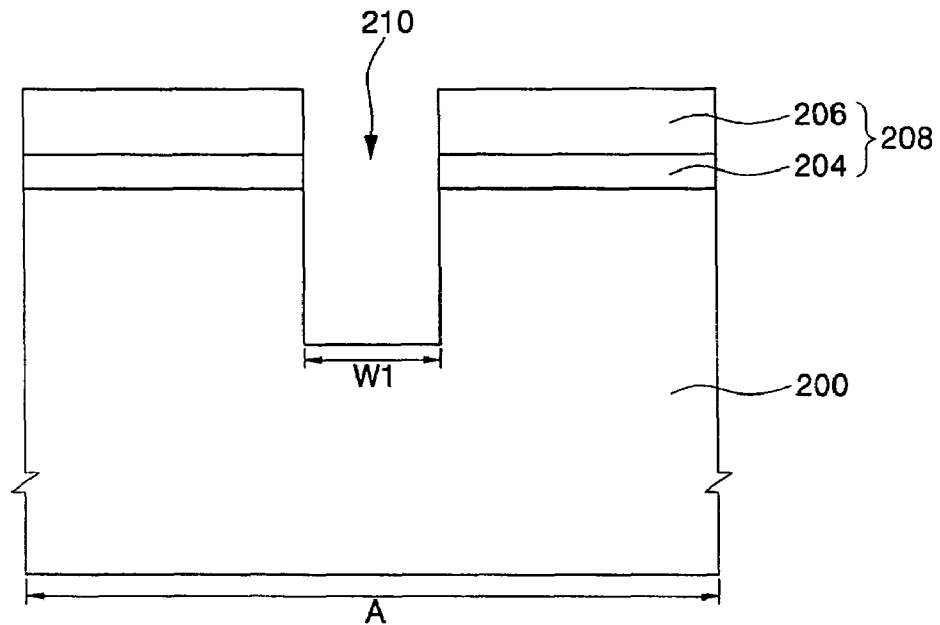
FIGS. 4A, 5A, 6A, 7A, 8A and 9A illustrate cross-sectional views, taken along line I-I' of FIG. 2, of stages in a method of fabricating a MOS transistor, in accordance with an embodiment of the present invention.
Figure 4B:
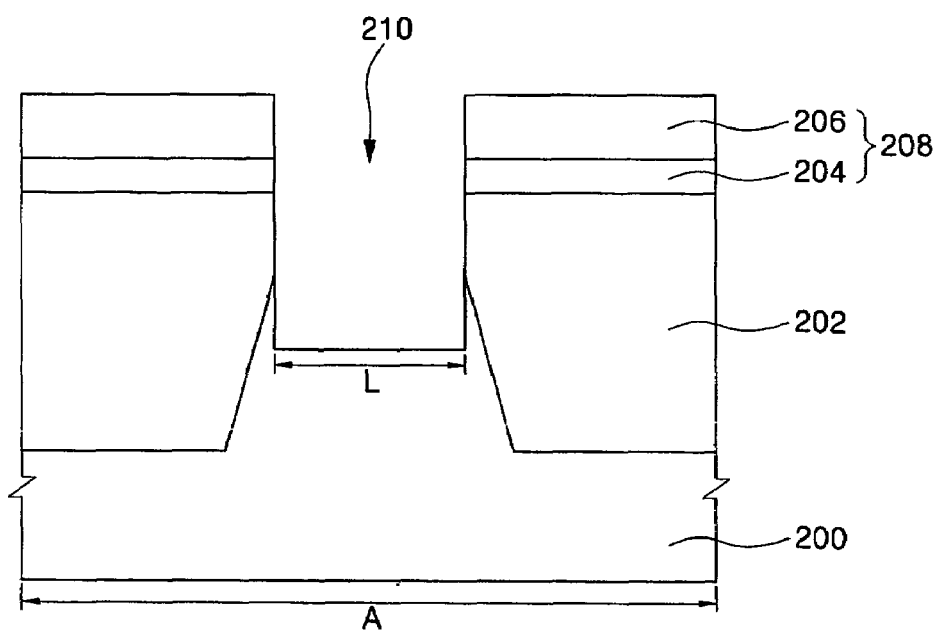
FIGS. 4B, 5B, 6B, 7B, 8B and 9B illustrate cross-sectional views, taken along line II-II' of FIG. 2, of stages in a method of fabricating a MOS transistor, in accordance with an embodiment of the present invention.

FIGS. 4B, 5B, 6B, 7B, 8B and 9B illustrate cross-sectional views, taken along line II-II' of FIG. 2, of stages in a method of fabricating a MOS transistor, in accordance with an embodiment of the present invention Referring to FIGS. 2, 4A and 4B, an isolation layer 202 is formed in a predetermined region of the semiconductor substrate 200 to define an active region A. The isolation layer 202 may be formed using a shallow trench isolation (STI) method. A mask pattern 208 is formed so as to have an opening crossing the active region A on the semiconductor substrate 100. The mask pattern 208 may have good etch selectivity with respect to the semiconductor substrate 200. The mask pattern 208 may have a stacked structure of a pad oxide layer 204 and a pad nitride layer 206. Intervals between the mask patterns 208 are formed to be almost equal to an expected gate width. A portion of the active region A is selectively etched using the mask pattern 208 as an etch mask to form a channel trench region 210 having a predetermined width W1. The channel trench region 210 is formed in consideration of the channel length. The channel trench region 210 may have a depth of 1400 Å to 1800 Å and a width of 1000 Å to 1200 Å.

Figure 5A:
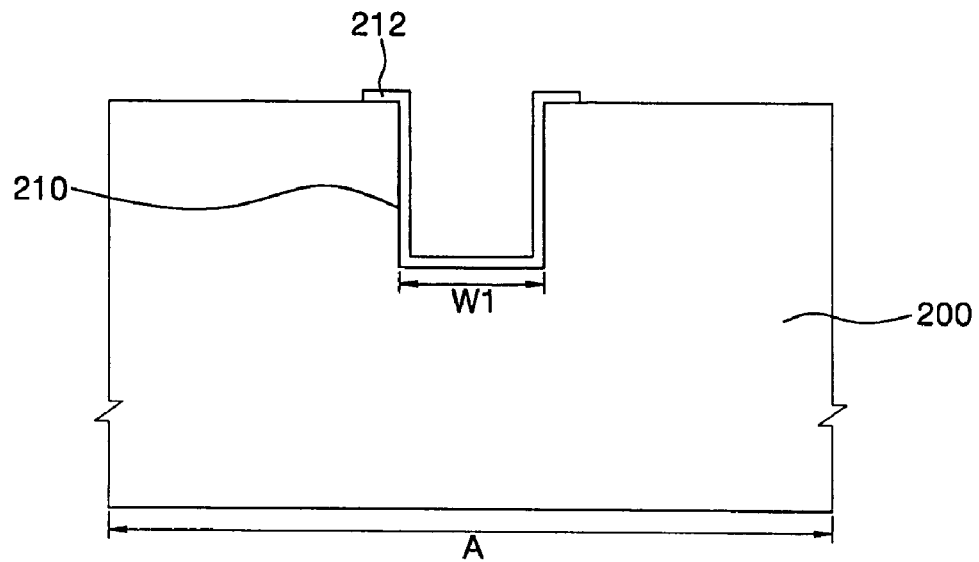
Figure 5B:
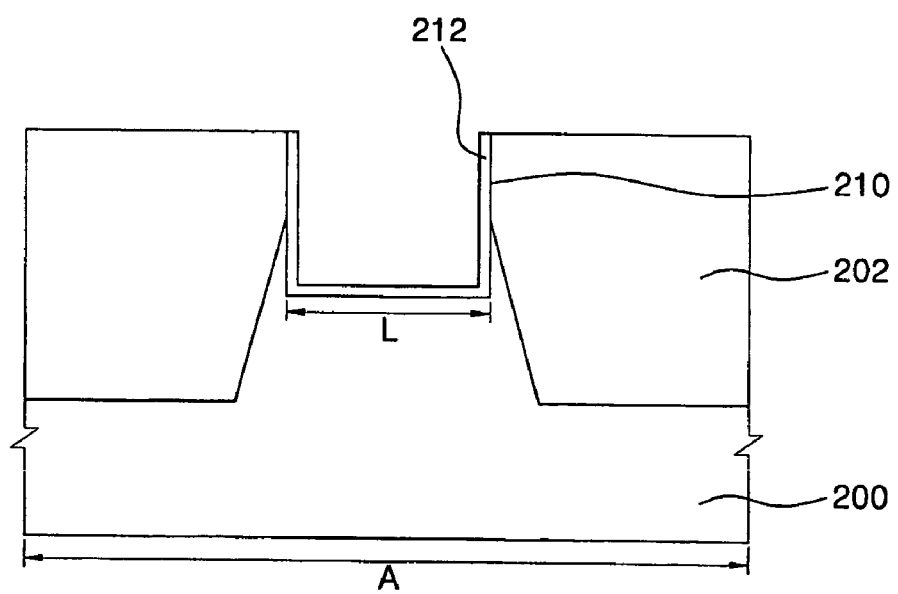

Referring to FIGS. 2, 5A and 5B, the mask pattern 208 used for the process of etching the channel trench region 210 is removed, e.g., by an etching process. Subsequently, the lower and upper corners of the channel trench region 200 may be rounded, e.g., by a process employing a wet cleaning process using SC-1 cleaning solution mixed with $NH_4OH$, $H_2O_2$ and $H_2O$, or a dry cleaning process using chemicals reacting with the semiconductor substrate 200. A gate insulating layer 212 covering the active region A and the bottom and sidewalls of the channel trench region 210 may be conformally formed. The gate insulating layer 212 may be formed using a thermal oxidation process. The gate insulating layer 212 is patterned to make the extended gate insulating layer, which remains at a portion of the active region A and at the bottom and sidewalls of the channel trench region 210, and to expose other regions of the active region A.

Figure 6A:
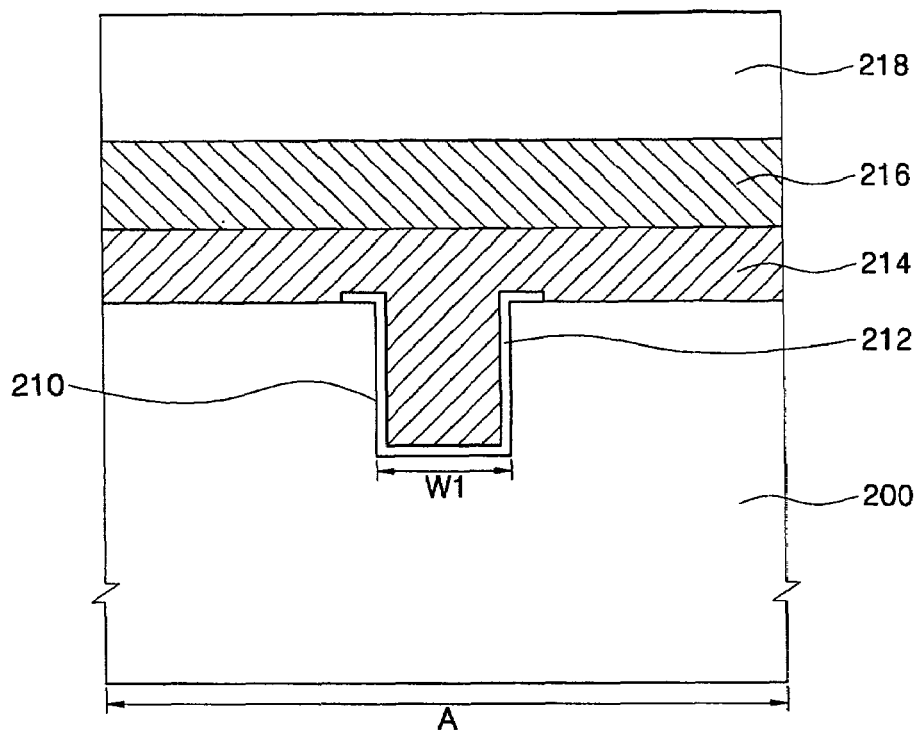
Figure 6B:
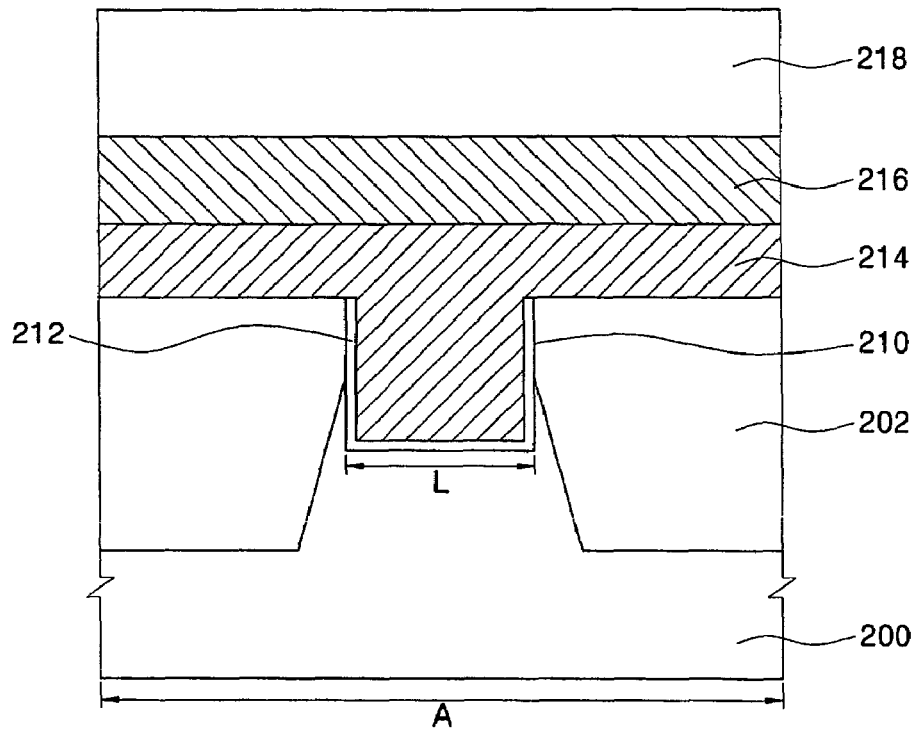

Referring to FIGS. 2, 6A and 6B, a lower conductive layer 214 is formed on an entire surface of the semiconductor substrate 200 having the gate insulating layer 212 to thereby fill the channel trench region 210 covered by the gate insulating layer 212. A material having good step coverage, e.g., a doped polysilicon layer, may be employed for the lower conductive layer 214. The lower conductive layer 214 may be formed to have a thickness of 800 Å to 1000 Å. An upper conductive layer 216 is formed on the lower conductive layer 214. The upper conductive layer 216 may be formed to have a thickness of 1000 Å to 1200 Å. The upper conductive layer 216 may be formed of a metal silicide layer, for example, a tungsten silicide layer. A hard mask layer 218 is formed on the upper conductive layer 216. The hard mask layer 218 may be a silicon nitride layer and may have a thickness of 1800 Å to 2000 Å.

Figure 7A:
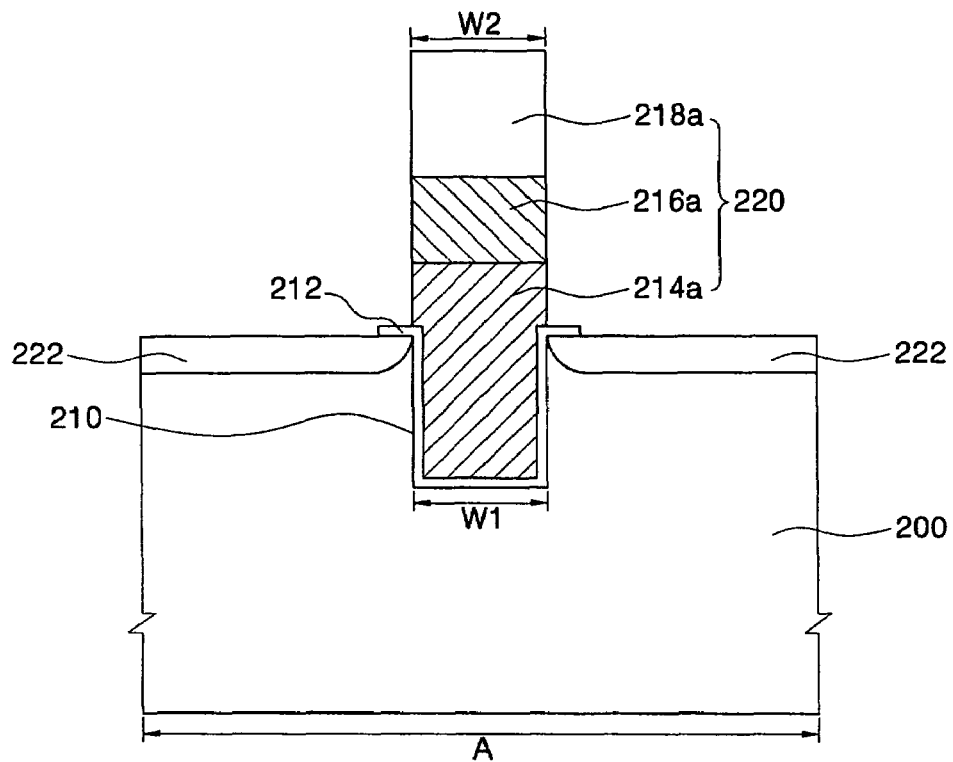
Figure 7B:
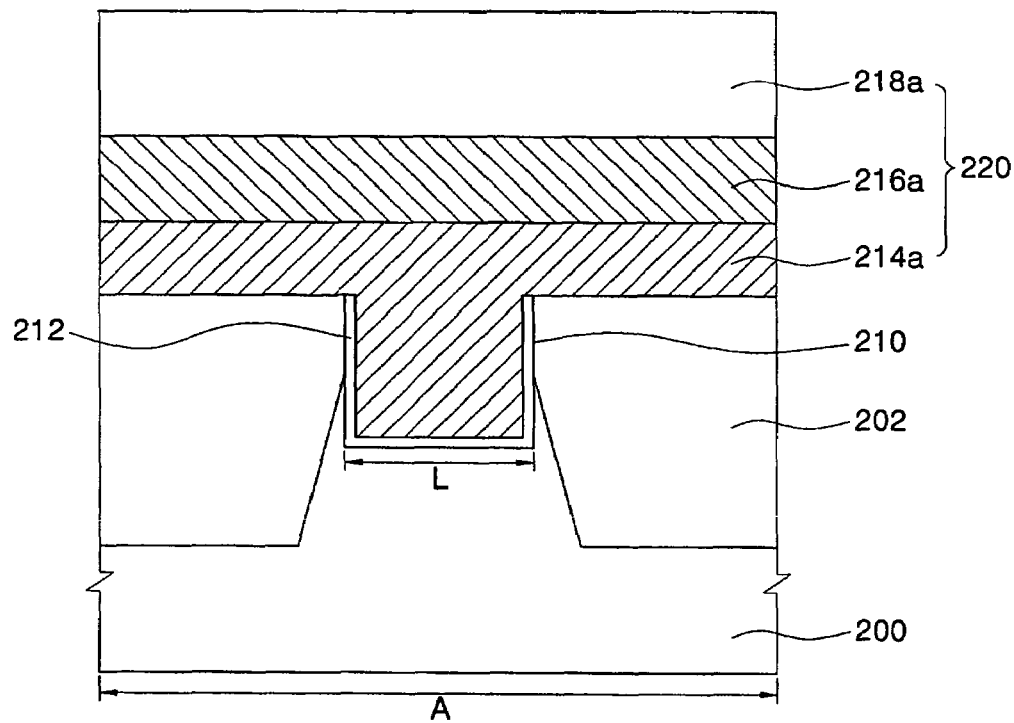

Referring to FIGS. 2, 7A and 7B, the hard mask layer 218 is patterned, e.g., using photolithography and etching processes, to form a hard mask pattern 218a. The upper conductive layer 216 and the lower conductive layer 214 are sequentially patterned by etching using the hard mask pattern 218a as an etch mask. As a result, a gate pattern 220 composed of a lower conductive layer pattern 214a, an upper conductive layer pattern 216a and the hard mask pattern 218a is formed. A top width W2 of the gate pattern 220 may be substantially equal to the width W1 of the channel trench region 210.

Figure 8A:
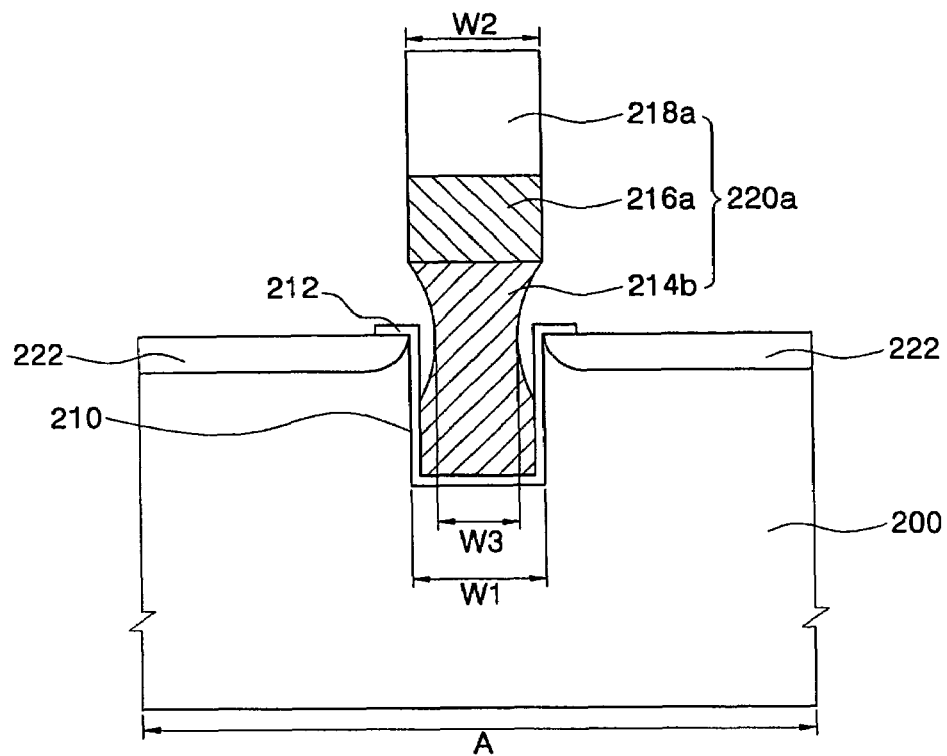
Figure 8B:
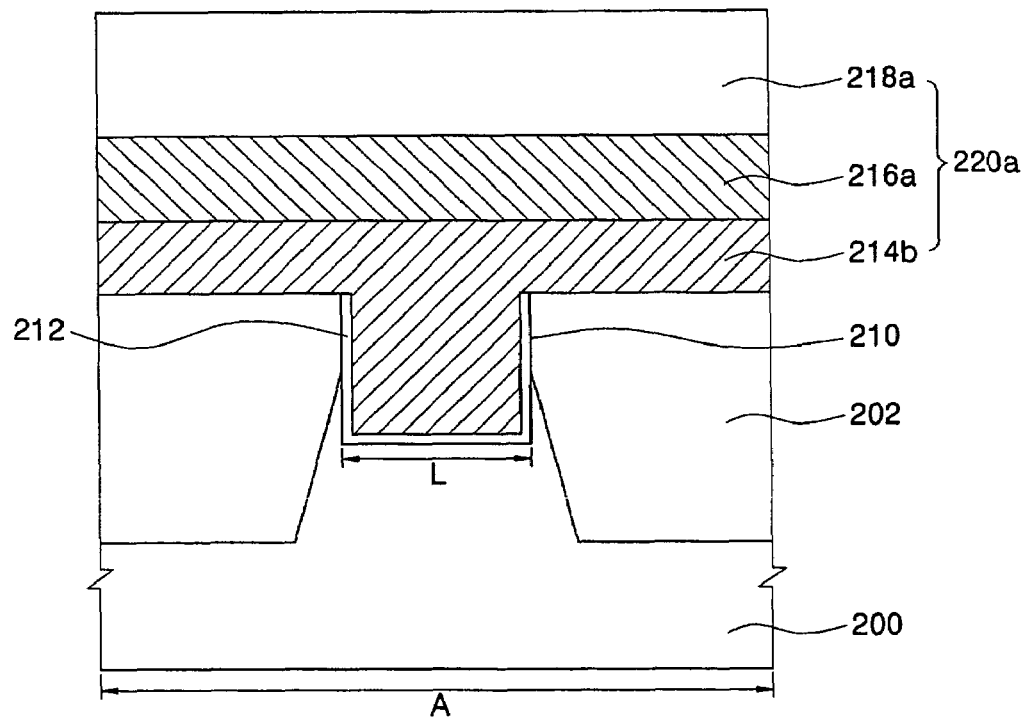

Referring to FIGS. 2, 8A and 8B, a sidewall of the lower conductive layer pattern 214a is selectively etched. The width of the lower conductive layer pattern 214a adjacent to the upper corner of the active region A is preferably decreased by the selective etching process. Thus, a recessed lower conductive layer pattern 214b having decreased width, and a recessed gate pattern 220a composed of the recessed lower conductive layer pattern 214b, the upper conductive layer pattern 216a and the hard mask pattern 218a are formed. As a result, a width W3 of the recessed lower conductive layer pattern 214b at the upper part of the channel trench region 210 preferably becomes smaller than the top width W2 of the recessed gate pattern 220a and the width W1 of the channel trench region 210. The selective etching process is preferably carried out to remove only the lower conductive layer pattern 214a while maintaining an isotropic etching property. That is, the etching process is preferably isotropic and selectively etches the material forming the lower conductive layer pattern 214a. The selective etching process may be carried out using an etching gas having an isotropic etching property, e.g., by chemical dry etching. A gas mixed with HBr and $O_2$ may be employed for the isotropic etching process. The isotropic etching process may be carried out with a bias power of 80 W or less; for example, 40 W to 80 W. If the bias power is too high, linearity of the etching gas increases, and it becomes difficult to isotropically etch sidewalls of the gate pattern. The selective etching process is preferably carried out to etch sidewalls of the lower conductive layer pattern 214a by about 100 Å to 300 Å. If etching proceeds too far, the recessed gate pattern 220a may collapse. If the lower conductive layer pattern 214a is not etched far enough, the concentrated electric field at the upper sidewall of the channel trench region 210 may not be prevented.

Figure 9A:
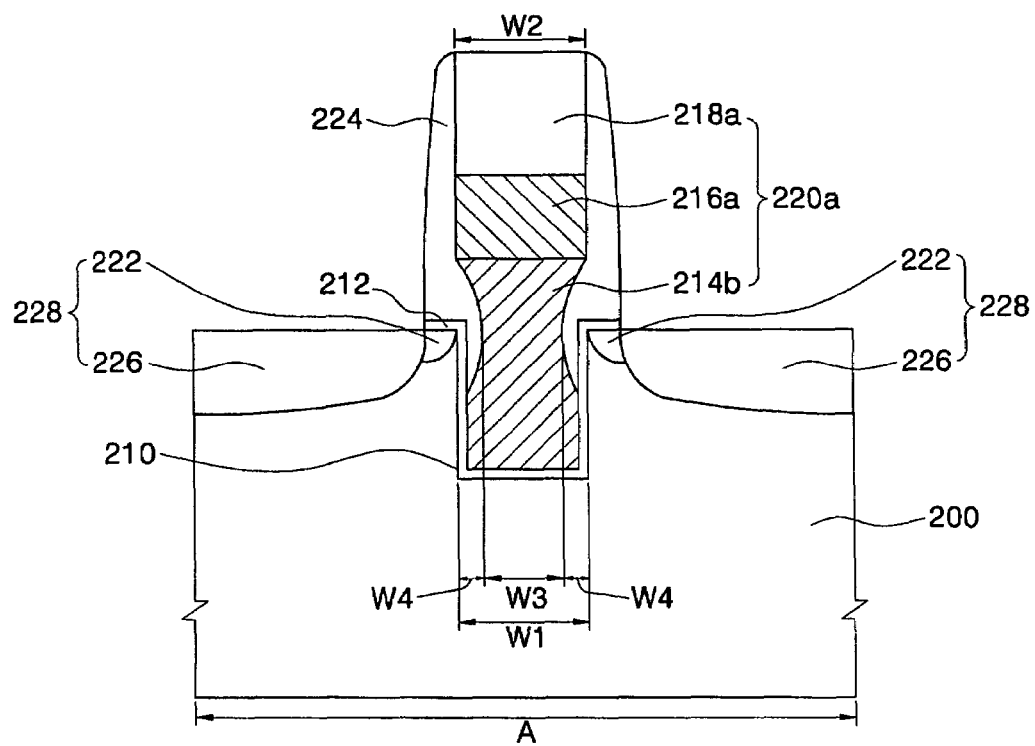
Figure 9B:
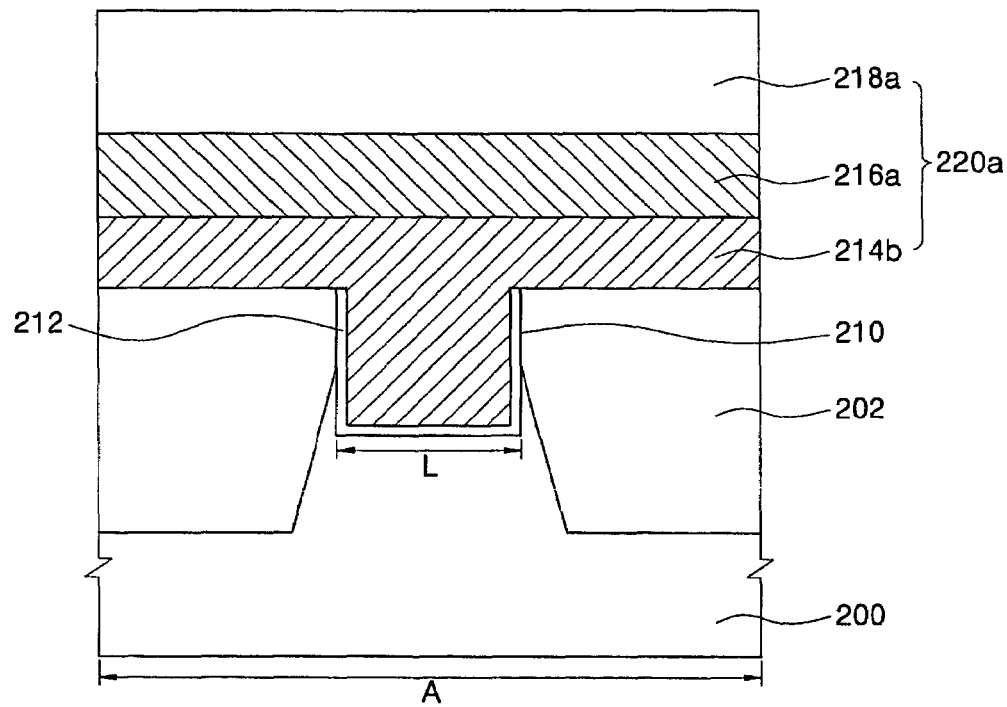

Referring to FIGS. 2, 9A and 9B, lightly doped impurity ions may be implanted into the active region A using the recessed gate pattern 220a as an ion implantation mask to form a lightly doped impurity region 222. An insulating layer to be used as a spacer may be conformally formed on the semiconductor substrate 200, where the lightly doped impurity region 222 and the recessed gate pattern 220a are formed. The insulating layer may be patterned using an anisotropic etching process to form an insulating layer spacer 224. The insulating layer spacer 224 may cover the sidewalls of the recessed gate pattern 220a as well as a recessed portion of recessed lower conductive layer pattern 214b in the upper part of the channel trench region 210. As a result, the upper corner of the active region A and the recessed lower conductive layer pattern 214b are spaced apart from each other by a distance W4, which includes the thickness of the insulating layer spacer 224 filling the upper part of the channel trench region 210 plus the thickness of the gate insulating layer 212. Accordingly, concentration of the electric field at the upper corner of the active region A may be alleviated.

Heavily doped impurity ions may be implanted into the active region A using the recessed gate pattern 220a, the insulating layer spacer 224 and the isolation layer 202 as ion implantation masks to form a heavily doped impurity region 226. Accordingly, source and drain regions 228 having the lightly doped impurity region 222 and the heavily doped impurity region 224 may be formed.

Figure 10:
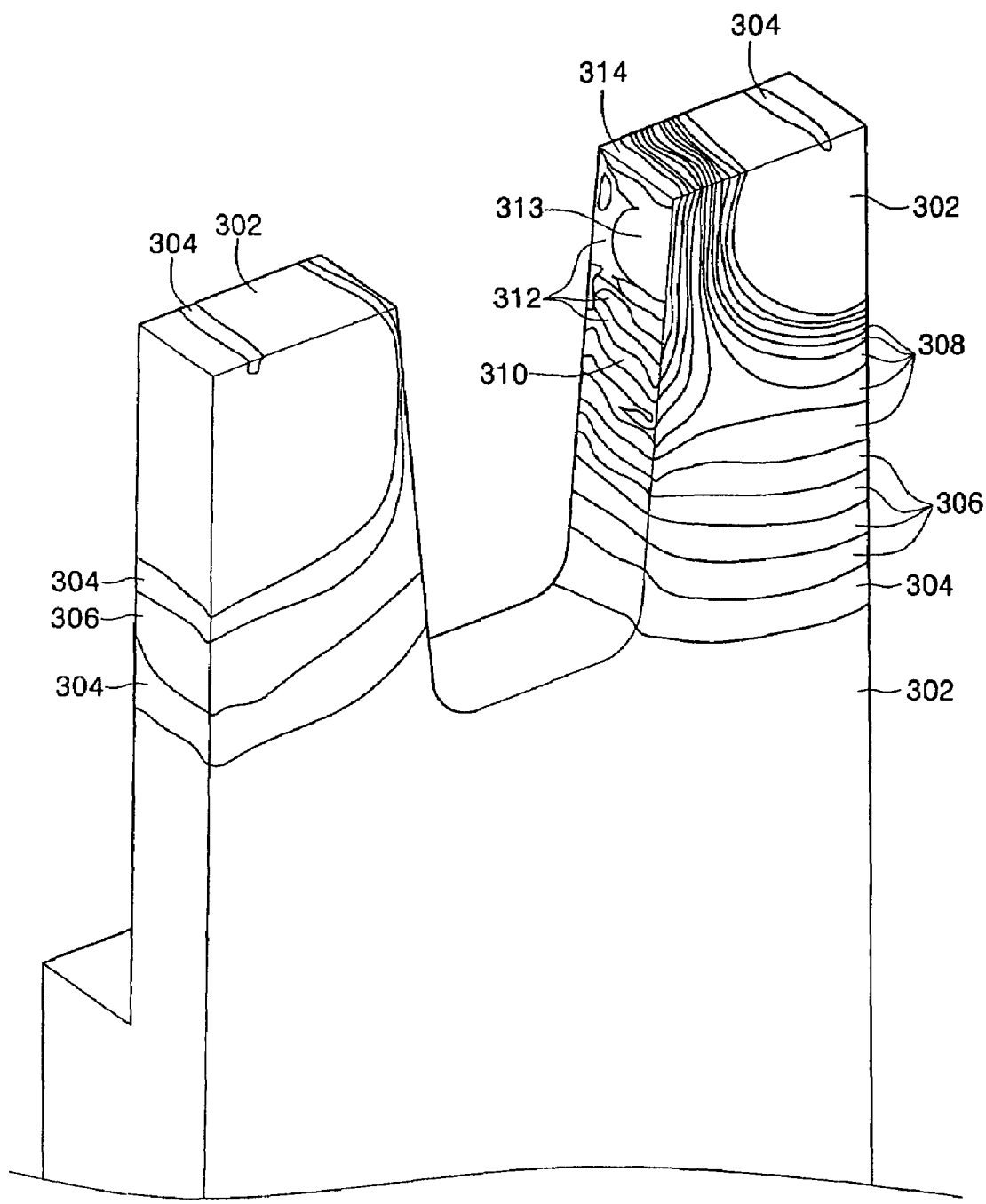
FIG. 10 illustrates a simulated electric field distribution within a semiconductor substrate of a conventional MOS transistor having the configuration of FIG. 1.
Figure 11:
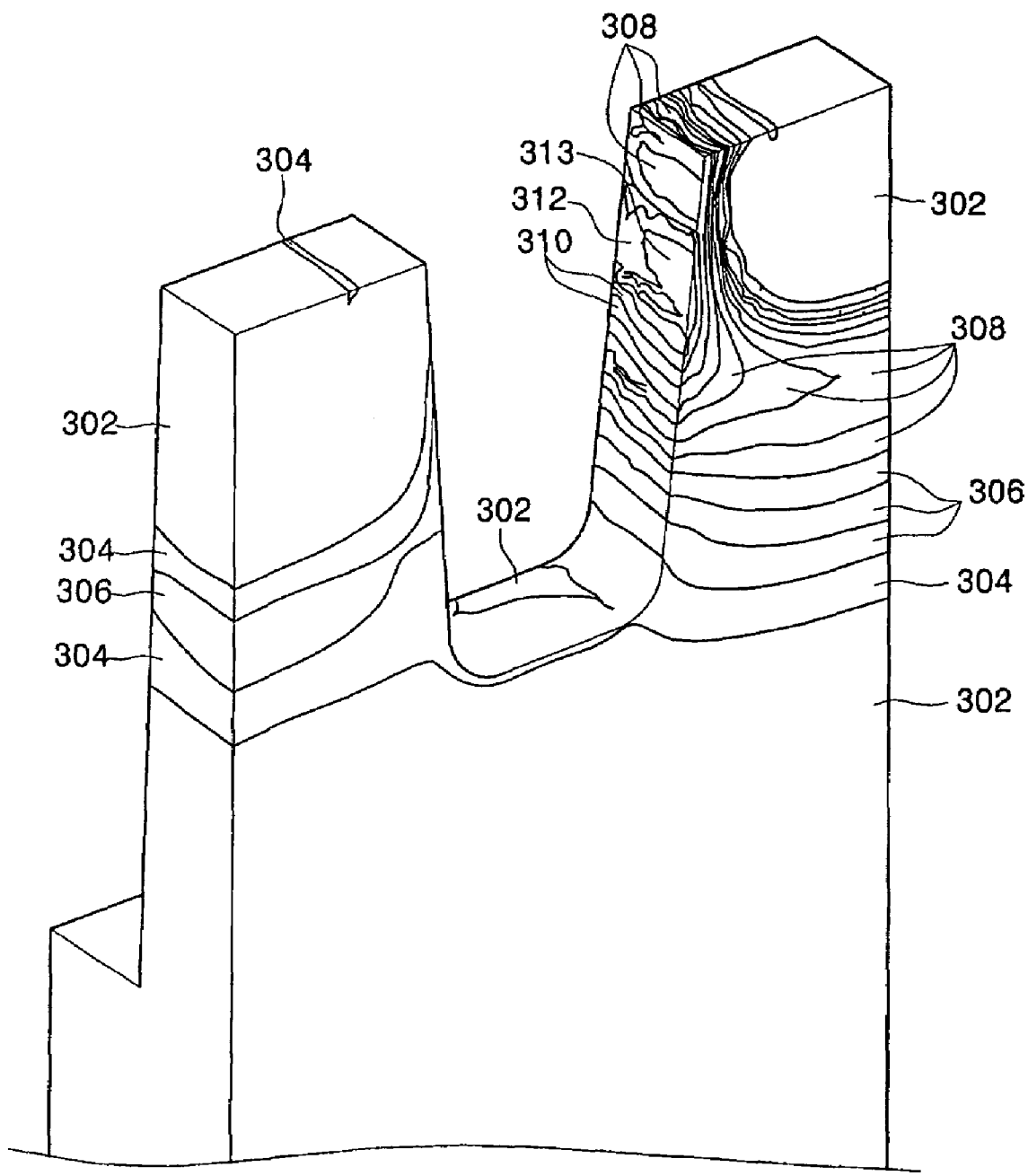
FIG. 11 illustrates a simulated electric field distribution within a semiconductor substrate of a MOS transistor having the configuration of FIG. 3A.

FIGS. 10 and 11 illustrate a simulated electric field distribution within a semiconductor substrate of a conventional MOS transistor and a MOS transistor in accordance with an embodiment of the present invention, respectively. In these illustrations, a region 302 has no electric field generated therein, while regions 304, 306, 308, 310, 312, 313 and 314 are regions having increasing electric fields therein. In particular, region 304 has an electric field of about $0.1 \times 10^5$ to $1.0 \times 10^5$ V/cm; region 306 has an electric field of about $1.0 \times 10^5$ V/cm to $2.1 \times 10^5$ V/cm; region 308 has an electric field of about $2.1 \times 10^5$ V/cm to $4.3 \times 10^5$ V/cm; region 310 has an electric field of about $4.3 \times 10^5$ V/cm to $5.4 \times 10^5$ V/cm; region 312 has an electric field of about $5.4 \times 10^5$ V/cm to $6.5 \times 10^5$ V/cm; region 313 has an electric field of about $6.5 \times 10^5$ V/cm to $7.6 \times 10^5$ V/cm; and region 314 has an electric field of about $7.6 \times 10^5$ V/cm to $8.6 \times 10^5$ V/cm.

FIG. 10 illustrates a simulated electric field distribution within a semiconductor substrate of a MOS transistor having the configuration of FIG. 1, and illustrates the electric field distribution within the semiconductor substrate when a substrate bias voltage of −0.7V, a gate voltage of 3.7V, and a drain voltage of 2V were applied to the MOS transistor having the configuration of FIG. 1.

In comparison, for a conventional MOS transistor having a recessed gate electrode, with reference to FIGS. 1 and 10, the top corner of the active region A and the gate pattern 114 are spaced apart from each other by the thickness of the gate insulating layer 106. Accordingly, if a voltage is applied thereto when a sufficient space between the top corner of the active region A and the gate pattern 114 is not ensured, an electric field, which is as high as about $7.6 \times 10^5$ V/cm to $8.6 \times 10^5$ V/cm, denoted in the region 314, may become concentrated at the top corner of the active region A. Consequently, degradation may occur due to the concentrated electric field, which may cause the threshold voltage of the device to be lowered and the leakage current to be increased, thereby deteriorating the reliability of the device.

FIG. 11 illustrates a simulated electric field distribution within a semiconductor substrate of a MOS transistor having the configuration of FIG. 3A, which illustrates the electric field distribution within the semiconductor substrate when a substrate bias voltage of −0.7V, a gate voltage of 3.7V, and a drain voltage of 2V were applied to the MOS transistor having the configuration of FIG. 3A.

Referring to FIGS. 3A and 11 the side wall of the gate pattern 220a is partially recessed at the top corner region of the channel trench region 210 adjacent to the top corner of the active region A. The recessed portion is filled with the insulating layer spacer 224. Thus, the top corner of the active region A and the gate pattern 220a of the top corner region of the channel trench region 210 are spaced apart from each other by the combined thickness of the gate insulating layer 212 and the insulating layer spacer 224. The top corner of the active region A having a predetermined interval spaced from the gate pattern 220a has an electric field of $2.1 \times 10^5$ V/cm to $4.3 \times 10^5$ V/cm, denoted by the region 308 of FIG. 11. Therefore, it can be seen that the electric field concentration is alleviated, as compared to the conventional art shown in FIG. 10. Accordingly, the degradation of the device may be prevented so that the leakage current is suppressed and the threshold voltage is maintained, which may thereby enhance the reliability of the device.

In addition, it can be seen that the region 313 having the highest electric field in FIG. 11 is distributed within the active region A adjacent to the sidewall of the channel trench region 210. This region 313, however, has an electric field lower than that of the region 314 having the highest electric field in FIG. 10. This is because the gate insulating layer 212 formed by the thermal oxidation process has a greater thickness at the sidewall of the channel trench region 210 compared to the top corner of the active region A.

In a MOS transistor having a recessed gate electrode according to the present invention, the sidewall of the gate pattern may be recessed using an isotropic etching process at the upper part of the channel trench region in contact with the upper corner of the active region, and the recessed portion may be filled with the insulating layer spacer. The upper corner of the active region and the gate pattern may be spaced apart by at least a predetermined interval, so that concentration of the electric field is alleviated. Leakage current of the device may be suppressed and threshold voltage of the device may be sustained, thereby enhancing reliability.

Concentration of the electric field on the channel trench may be prevented without a reduction in the active area due to increased trench width, so that degradation of the current drivability of the device may be prevented.

Exemplary embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A metal oxide semiconductor transistor having a recessed gate electrode, comprising:
   a semiconductor substrate;
   an isolation layer disposed in the semiconductor substrate to define an active region;
   a channel trench disposed within the active region and crossing the active region;
   a gate insulating layer covering a bottom and sidewalls of the channel trench; and
   a gate pattern disposed to cross above the active region and fill the channel trench, wherein:
      the gate pattern has a recessed sidewall that is recessed adjacent to an upper corner of the channel trench, and
      a width of the gate pattern at the recessed sidewall is smaller than a width of the gate pattern at a topmost surface of the gate pattern.

2. The transistor as claimed in claim 1, further comprising an insulating layer spacer covering the recessed sidewall of the gate pattern.

3. The transistor as claimed in claim 2, wherein the insulating layer spacer is formed to fill the recessed sidewall at the upper corner of the channel trench.

4. The transistor as claimed in claim 2, wherein the insulating layer spacer is a silicon oxide layer or a silicon nitride layer.

5. The transistor as claimed in claim 1, wherein:
   the gate pattern is a stacked structure including a lower conductive layer pattern and an upper conductive layer pattern, and
   the recessed sidewall is formed in the lower conductive layer pattern.

6. The transistor as claimed in claim 1, wherein a width of the channel trench is in a range of 1000 Å to 1200 Å.

7. The transistor as claimed in claim 1, wherein the width of the gate pattern at the recessed sidewall adjacent to the upper corner of the channel trench is 100 Å to 300 Å smaller than the width of the gate pattern at the topmost surface of the gate pattern.

8. A transistor having a recessed gate, comprising:
   a gate formed in a gate trench, the gate having a concave sidewall, wherein an upper curved portion of the concave sidewall extends above an upper surface of the gate trench and a lower curved portion of the concave sidewall extends below the upper surface of the gate trench.

9. The transistor as claimed in claim 8, wherein a width of the gate at the upper surface of the gate trench is less than a width of the gate above the upper surface of the gate trench and is less than a width of the gate below the upper surface of the gate trench.

10. The transistor as claimed in claim 8, further comprising an insulating layer formed along the concave sidewall and having a convex portion formed along the upper and lower curved portions of the concave sidewall.

11. A method of fabricating a metal oxide semiconductor transistor having a recessed gate electrode, comprising:
    forming an isolation layer within a semiconductor substrate to define an active region;
    forming a channel trench within the active region and crossing the active region;
    forming a gate insulating layer covering a bottom and sidewalls of the channel trench; and
    forming a pattern crossing the active region and filling the channel trench, wherein:
       the gate pattern has a recessed sidewall that is recessed adjacent to an upper corner of the channel trench, and
       a width of the gate pattern at the recessed sidewall is smaller than a width of the gate pattern at a topmost surface of the gate pattern.

12. The method as claimed in claim 11, wherein forming the gate pattern having the recessed sidewall comprises:
    forming a lower conductive layer filling the channel trench covered by the gate insulating layer;
    forming an upper conductive layer on the lower conductive layer;
    patterning the upper conductive layer and the lower conductive layer; and
    performing an isotropic etching process to partially recess a sidewall of the patterned lower conductive layer at the upper part of the channel trench.

13. The method as claimed in claim 11, wherein the channel trench is formed to a width of 1000 Å to 1200 Å.

14. The method as claimed in claim 12, wherein the partially recessed sidewall of the patterned lower conductive layer is etched by about 100 Å to about 300 Å in the isotropic etching process.

15. The method as claimed in claim 12, wherein the lower conductive layer includes polysilicon.

16. The method as claimed in claim 12, wherein the upper conductive layer includes a metal silicide.

17. The method as claimed in claim 16, wherein the metal silicide includes tungsten silicide.

18. The method as claimed in claim 12, wherein the isotropic etching process is carried out using a gas including HBr and $O_2$.

19. The method as claimed in claim 12, wherein the isotropic etching process is carried out using a bias power of 40 W to 80 W.

20. The method as claimed in claim 12, further comprising forming an insulating layer spacer covering sidewalls of the gate pattern and filling the partially recessed sidewall of the patterned lower conductive layer.

21. The method as claimed in claim 20, wherein forming the insulating layer spacer includes:
    forming a conformal insulating layer; and
    anisotropically etching the insulating layer to form the insulating layer spacer covering the sidewall of the gate pattern.

* * * * *